United States Patent
Okada

Patent Number: 5,392,658
Date of Patent: Feb. 28, 1995

[54] DETECTOR FOR FORCE, ACCELERATION OR MAGNETISM WITH RESPECT TO COMPONENTS IN MULTI-DIMENSIONAL DIRECTIONS

[76] Inventor: Kazuhiro Okada, 73, Sugaya 4-chome, Ageo-shi, Saitama, 362, Japan

[21] Appl. No.: 249,817

[22] Filed: May 26, 1994

Related U.S. Application Data

[62] Division of Ser. No. 960,545, Oct. 13, 1992, Pat. No. 5,343,765.

[30] Foreign Application Priority Data

Oct. 25, 1991 [JP] Japan .................. 3-306587

[51] Int. Cl.$^6$ .................................. G01L 5/04
[52] U.S. Cl. .................. 73/862.043; 324/259
[58] Field of Search ............. 73/862.042, 862.043, 73/862.626, 862.638, 517 R, 767, 794; 324/244, 259; 310/338

[56] References Cited

U.S. PATENT DOCUMENTS

| | | | |
|---|---|---|---|
| 4,431,935 | 2/1984 | Rider | 310/331 |
| 4,719,538 | 1/1988 | Cox | 361/283 |
| 4,745,812 | 5/1988 | Amazeen | 73/862.04 |
| 4,905,523 | 3/1990 | Okada | 73/862.044 |

FOREIGN PATENT DOCUMENTS

| | | |
|---|---|---|
| 0133997 | 7/1991 | European Pat. Off. . |
| 9110118 | 7/1991 | European Pat. Off. . |
| 0480471 | 4/1992 | European Pat. Off. . |
| 9217759 | 10/1992 | WIPO . |

OTHER PUBLICATIONS

Woffenuttel, R. F. "Compliant Capacitive Wrist . . . " IEEE Transactions on Instrumentation and Measurement, No. 6. N.Y. pp. 991–997.

Primary Examiner—Robert Raevis
Attorney, Agent, or Firm—Ladas & Parry

[57] ABSTRACT

On the upper surface of a flexible substrate, four displacement electrodes are arranged. A fixed substrate is arranged thereabove, and fixed electrodes opposite to the displacement electrodes are respectively arranged on the fixed substrate. These displacement electrodes and the fixed electrodes form capacitance elements C1 to C4, respectively. A columnar working body is fixed on the lower surface of the flexible substrate. A bending is produced in the flexible substrate on the basis of an acceleration exerted thereon. As a result, capacitance values of the respective capacitance elements C1 to C4 vary. The capacitance values of the capacitance elements C1 to C4 are converted to respective voltage values V1 to V4. A component in the X-axis direction is obtained as $Vx=(V1+V4)-(V2+V3)$, a component in the Y-axis direction is obtained as $Vy=(V1+V2)-(V3+V4)$, and a component in the Z-axis direction is obtained as $Vz=V1+V2+V+V4$.

6 Claims, 12 Drawing Sheets

PRIOR APPLICATION

PRIOR APPLICATION

PRIOR APPLICATION

PRIOR APPLICATION

PRIOR APPLICATION

PRIOR APPLICATION

DETECTOR FOR FORCE, ACCELERATION OR MAGNETISM WITH RESPECT TO COMPONENTS IN MULTI-DIMENSIONAL DIRECTIONS

This is a divisional of application Ser. No. 07/960,545, filed on Oct. 13, 1992, now U.S. Pat. No. 5,343,765.

BACKGROUND OF THE INVENTION

This invention relates to a detector for force, acceleration or magnetism, and more particularly to a detector capable of obtaining detection values every respective components in multi-dimensional directions.

In the automobile industry, or machinery industory, there has been an increased demand for detectors capable of precisely detecting a physical quantity such as force, acceleration or magnetism. Particularly, miniaturized detectors capable of detecting such physical quantities every respective components in two-dimensional or three-dimensional directions are desired.

In order to cope with such demand, there has been proposed a detector for force/acceleration/magnetism in which gauge resistors are formed on a semiconductor substrate such as silicon, etc. to transform a mechanical distortion produced in the substrate on the basis of a force applied from the external to an electric signal by making use of the piezo resistance effect. However, such detector using gauge resistor has the problem that the manufacturing cost is high and any temperature compensation is required.

In view of this, in recent years, there has been proposed a detector in which capacitance elements or piezoelectric elements are used to carry out detection of a physical quantity. For example, in the U.S. Pat. application Ser. No. 07/761,771 (European Patent Application No. 91900948.0), a novel detector utilizing changes in the electrostatic capacity has been proposed. In this novel detector, a capacitance element is constituted by a fixed electrode formed on a fixed substrate and a displacement electrode producing a displacement by action of a force. Respective components in multi-dimensional directions of an applied force can be detected on the basis of changes in the electrostatic capacity of the capacitance element. Further, in the U.S. Pat. application Ser. No. 07/764,159 (European Patent Application No. 91117418.0), a method of manufacturing such a novel detector is disclosed. In the No. PCT/JP91/00428 according to the International Application based on the Patent Cooperation Treaty, a method of testing or inspecting such a novel detector is disclosed. In addition, in the No. PCT/JP92/00882, a detector using piezoelectric element in place of capacitance element is disclosed.

In the above-described detectors, a plurality of capacitance elements or piezoelectric elements are arranged in a two-dimensional manner to detect components in multi-dimensional directions of a physical quantity in an XYZ three-dimensional coordinate system. Namely, detection elements for detecting a physical quantity in the X-axis direction are arranged on the X-axis, and detection elements for detecting a physical quantity in the Y-axis direction are arranged on the Y-axis. Generally, since such a detector for physical quantity is required to be miniaturized, the area where respective detection elements can be arranged is limited. Accordingly, in order to permit the detection elements for the X-axis and the detection elements for the Y-axis to be independently arranged, the detection effective area (the area directly related to the detection sensitivity of a physical quantity, e.g., the electrode area constituting capacitance elements) for respective detection elements cannot but be limited. For this reason, there was the problem that according as miniaturization of the detector is made to more degree, the detection sensitivity is lowered accordingly.

SUMMARY OF THE INVENTION

With the above in view, an object of this invention is to provide a detector for force/acceleration/magnetism with respect to components in multi-dimensional directions in which detection elements are efficiently arranged in a limited area to thereby provide a high sensitivity.

The first feature of this invention resides in a force detector for detecting components in multi-dimensional directions of force in an XYZ three-dimensional coordinate system, comprising:

a fixed substrate having a fixed surface extending along substantially an XY plane, a displacement substrate having a displacement surface opposite to the fixed surface and extending along substantially the XY plane, a first capacitance element formed by a pair of electrodes provided so that they are opposite to each other on the fixed surface and the displacement surface corresponding to the first quadrant of the XY plane, a second capacitance element formed by a pair of electrodes provided so that they are opposite to each other on the fixed surface and the displacement surface corresponding to the second quadrant of the XY plane, a third capacitance element formed by a pair of electrodes provided so that they are opposite to each other on the fixed Surface and the displacement surface corresponding to the third quadrant of the XY plane, a fourth capacitance element formed by a pair of electrodes provided so that they are opposite to each other on the fixed surface and the displacement surface corresponding to the fourth quadrant of the XY plane, first detection means for detecting a force component in the X-axis direction on the basis of a difference between a sum of a capacitance value of the first capacitance element and a capacitance value of the fourth capacitance element and a sum of a capacitance value of the second capacitance element and a capacitance value of the third capacitance element when the force in the X-axis direction is exerted on a predetermined working point which causes a displacement of the displacement substrate, and second detection means for detecting a force component in the Y-axis direction on the basis of a difference between a sum of a capacitance value of the first capacitance element and a capacitance element of the second capacitance element and a sum of a capacitance value of the third capacitance element and a capacitance value of the fourth capacitance element when the force in the Y-axis direction is exerted on the working point, thus permitting detection of a force in an XY two dimensional directions.

The second feature of this invention resides in that, in the above described detector having the first feature, there is further provided third detection means for detecting a force component in the Z-axis direction on the basis of either (1) a sum of a capacitance value of the first capacitance element and a capacitance value of the third capacitance element, or (2) a sum total of a capacitance value of the first capacitance element, a capacitance value of the second capacitance element, a capacitance value of the third capacitance element and a capacitance value of the fourth capacitance element when the force in the Z-axis direction is exerted on the working point, thus permitting detection of force components in the XYZ three-dimensional directions of force.

The third feature of this invention resides in that, in the above described detector having the second feature, there is further provided a fifth capacitance element formed by a pair of electrodes provided so that they are opposite to each other on the fixed surface and the displacement surface in the vicinity of the origin of the XY plane, and that the third detection means carries out detection of a force component in the Z-axis direction by using a capacitance value of the fifth capacitance element.

The fourth feature of this invention resides in a force detector for detecting components in multi-dimensional directions of force in an XYZ three-dimensional coordinate system, comprising:

a fixed substrate having a fixed surface extending along substantially an XY plane, a displacement substrate having a displacement surface opposite to the fixed surface and extending along substantially the XY plane, a first detection element formed so that it is put between the fixed surface and the displacement surface corresponding to the first quadrant of the XY plane, the first detection element including a piezoelectric element to transform a pressure applied to the displacement surface to an electric signal, and to output the transformed electric signal as a detection value, a second detection element formed so that it is put between the fixed surface and the displacement surface corresponding to the second quadrant of the XY plane, the second detection element including a piezoelectric element to transform a pressure applied to the displacement surface to an electric signal, and to output the transformed electric signal as a detection value, a third detection element formed so that it is put between the fixed surface and the displacement surface corresponding to the third quadrant of the XY plane, the third detection element including a piezoelectric element to transform a pressure applied to the displacement surface to an electric signal, and to output the transformed electric signal as a detection value, a fourth detection element formed so that it is put between the fixed surface and the displacement surface corresponding to the fourth quadrant of the XY plane, the fourth detection element including a piezoelectric element to transform a pressure applied to the displacement surface to an electric signal, and to output the transformed electric signal as a detection value, first detection means for detecting a force component in the X-axis direction on the basis of a difference between a sum of a detection value by the first detection element and a detection value by the fourth detection element and a sum of a detection value by the second detection element and a detection value by the third detection element when the force in the X-axis direction is exerted on a predetermined working point which causes a displacement of the displacement substrate, and second detection means for detecting a force component in the Y-axis direction on the basis of a difference between a sum of a detection value by the first detection element and a detection value by the second detection element and a sum of a detection value by the third detection element and a detection value by the fourth detection element when the force in the Y-axis direction is exerted on the working point, thus permitting detection of components in the XY two dimensional directions of a force.

The fifth feature of this invention resides in that, in the above described detector having the fourth feature, there is further provided third detection means for detecting a force component in the Z-axis direction on the basis of either (1) a sum of a detection value by the first detection element and a detection value by the third detection element, or (2) a sum total of a detection value by the first detection element, a detection value by the second detection element, a detection value by the third detection element and a detection value by the forth detection element when the force in the Z-axis direction is exerted on the working point.

The sixth feature of this invention resides in that, in the above described detector having the fifth feature, there is further provided a fifth detection element formed so that it is put between the fixed surface and the displacement surface in the vicinity of the origin of the XY plane, the fifth detection element including a piezoelectric element to transform a pressure applied to the displacement surface to an electric signal, and to output the transformed electric signal as a detection value, and that the third detection means carries out detection of a force component in the Z-axis direction by using a detection value by the fifth detection element.

The seventh feature of this invention resides in a force detector for detecting components in multi-dimensional directions of force in an XYZ three-dimensional system:

wherein eight sets of detection elements each constituted by a piezoelectric element in a plate form, an upper electrode formed on the upper surface of the piezoelectric element, and a lower electrode formed on the lower surface of the piezoelectric element, are prepared, wherein the origin is defined at a point within a substrate having flexibility, an X-axis is defined so that it passes through the origin and extends in a direction parallel to the substrate surface, a Y-axis is defined so that it is perpendicular to the X-axis at the origin and extends in a direction parallel to the substrate surface, and a Z-axis is defined so that it passes through the origin and extends in a direction perpendicular to the substrate surface, wherein eight sets of detection elements are such that the first detection element is arranged on the substrate in a central area corresponding to the first quadrant of the XY plane, the second detection element is arranged on the substrate in a central area corresponding to the second quadrant of the XY plane, the third detection element is arranged on the substrate in a central area corresponding to the third quadrant of the XY plane, the fourth detection element is arranged on the substrate in a central area corresponding to the fourth quadrant of the XY plane, the fifth detection element is arranged on the substrate in a peripheral area corresponding to the first quadrant of the XY plane, the sixth detection element is arranged on the substrate in a peripheral area corresponding to the second quadrant of the XY plane, the seventh detection element is arranged on the substrate in a peripheral area corresponding to the third quadrant of the XY plane, and the eighth detection element is arranged on the substrate in a peripheral area corresponding to the fourth quadrant of the XY plane, one electrodes of these respective detection elements being fixed to the substrate, wherein either the peripheral portion of the substrate or the central portion in the vicinity of the origin thereof is fixed to a detector casing, wherein there is provided a working point having a function to transmit a force produced on the basis of a physical action exerted from the external to the peripheral portion or the central portion of the substrate, and wherein potentials of one electrodes with respect to the other electrodes fixed on the substrate are obtained in the respective detection elements, to detect a force component in the X-axis direction produced at the working point on the basis of a difference between a sum of respective potentials at the first, fourth, sixth and seventh detection elements and a sum of second, third, fifth and eighth detection elements, to detect a force component in the Y-axis direction produced at the working point on the basis of a difference between a sum of respective potentials at the first, second, seventh, and eighth detection elements and a sum of respective potentials at the third, fourth, fifth and sixth detection elements, and to detect a force component in the Z-axis direction produced at the working point on the basis of either (1) a difference between a sum of respective potentials at the first and the third detection elements and a sum of respective potentials at the fifth and the seventh detection elements, or (2) a difference between a sum of respective potentials at the first, second, third and fourth detection elements and a sum of respective potentials at the fifth, sixth, seventh and eighth detection elements.

The eighth feature of this invention resides in that, in the above described detectors, a force produced resulting from an acceleration is exerted on the working point, thus permitting detection of an acceleration.

The ninth feature of this invention resides in that, in the above described detectors, a force produced resulting from magnetism is exerted on the working point, thus permitting detection of magnetism.

In the conventional detector, detection elements for detecting a force component in the X-axis direction were arranged on the X-axis, and detection elements for detecting a force component in the Y-axis direction were on the Y-axis direction. On the contrary, the feature of this invention resides in that detection elements are arranged at the first, second, third and fourth quadrants with respect to the XY plane, respectively. These detection elements can respectively contribute to both detection of a force component in the X-axis direction and detection of a force component in the Y-axis direction, and can also contribute to a force component in the Z-axis direction according to need. For this reason, detection elements can be arranged by effectively utilizing a limited area. Thus, high sensitivity detection can be carried out.

DESCRIPTION OF THE PREFERRED EMBODIMENT

§1 Basic structure of the detector

Figure 1:
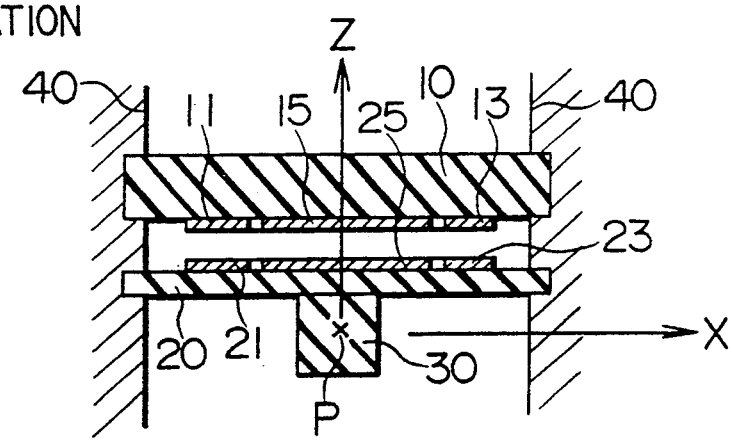
FIG. 1 is a side cross sectional view showing a basic structure of an acceleration detector conventionally proposed.
Figure 2:
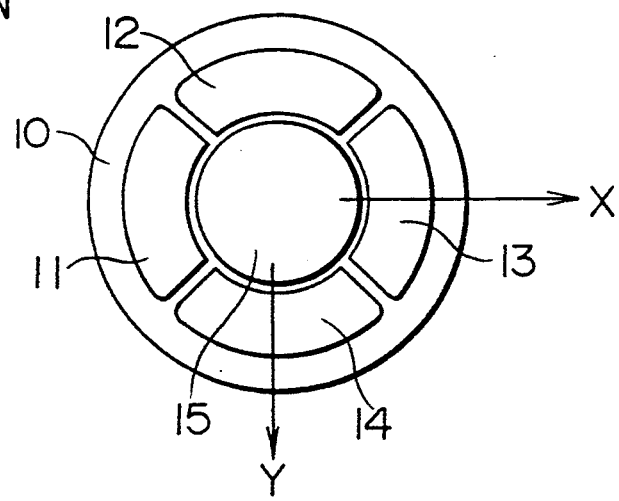
FIG. 2 is a bottom view of a fixed substrate 10 in the detector shown in FIG. 1. The cross section cut along the X-axis of the fixed substrate of 10 of FIG. 2 is shown in FIG. 1.
Figure 3:
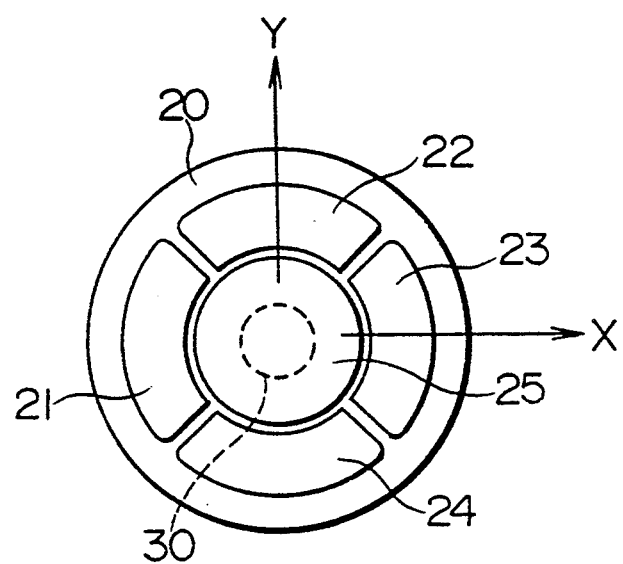
FIG. 3 is a top view of a flexible substrate 20 in the detector shown in FIG. 1. The cross section cut along the X-axis of the flexible substrate 20 of FIG. 3 is shown in FIG. 1.

Prior to the description of a detector according to this invention, the basic structure of a previous detector which is disclosed in the prior application (U.S. patent application Ser. No. 07/764,159 or European Patent Application No. 91117418.3) and the principle thereof will be briefly described. FIG. 1 is a side cross sectional view showing the basic structure of an acceleration detector to which this invention is applied. This detector comprises, as the major component, a fixed substrate 10, a flexible substrate 20, a working body 30, and a detector casing 40. The bottom view of the fixed substrate 10 is shown in FIG. 2. The cross section cut along the X-axis of the fixed substrate 10 in FIG. 2 is shown in FIG. 1. The fixed substrate 10 is formed as a disk shaped substrate as shown, and is fixed at the peripheral portion thereof to the detector casing 40. On the lower surface thereof, fan shaped fixed electrodes 11 to 14 and a disk shaped fixed electrode 15 are formed. On the other hand, the top view of the flexible substrate 20 is shown in FIG. 3. The cross section cut along the X-axis of the flexible substrate in FIG. 3 is shown in FIG. 1. The flexible substrate 20 is also formed as a disk shaped substrate as shown, and is fixed at the peripheral portion thereof to the detector casing 40. On the upper surface thereof, fan shaped displacement electrodes 21 to 24 and a disk shaped displacement electrode 25 are formed. The working body 30 is columnar as the upper surface thereof is indicated by broken lines in FIG. 3, and is coaxially connected to the lower surface of the flexible substrate 20. The detector casing 40 is cylindrical, and fixes and supports the peripheral portions of the fixed substrate 10 and the flexible substrate 20.

The fixed substrate 10 and the flexible substrate 20 are arranged with a predetermined splicing therebetween at positions in parallel to each other. While both substrates are a disk shaped substrate, the fixed substrate 10 is a substrate having high rigidity such that bending is difficult to occur, whereas the flexible substrate 20 is a substrate having flexibility such that when a force is applied, bending occurs. In the example shown in FIG. 1, the fixed substrate is caused to have high rigidity by allowing the thickness thereof to be thick, and the flexible substrate 20 is caused to have flexibility by allowing the thickness thereof to be thin. In addition to the above, they may be caused to have rigidity or flexibility by changing material thereof. Alternatively, by forming a groove in the substrate, or forming a through hole therein, such members may be caused to have flexibility. As long as the fixed substrate 10, the flexible substrate 20 and the working body 30 can perform their primary functions, they may be constituted with any material. For example, they may be constituted with semiconductor or glass, etc., or may be constituted with metal. It is to be noted that in the case where the fixed substrate 10 and the flexible substrate 20 are constituted with metal, it is necessary to adopt a method of forming insulating layers between the metal and the respective electrodes in order not to short circuit the electrodes, or similar methods. In addition, respective electrode layers may be constituted with any material as long as it has conductive property. Incidentally, when the fixed substrate 10, the flexible substrate 20 and the working body 30 are constituted by a semiconductor substrate or a glass substrate, the shape thereof is preferred to be a rectanglar instead of a disk and the shape of the respective electrodes is preferred to be a rectanglar instead of a fan for easy assembly.

Figure 4:
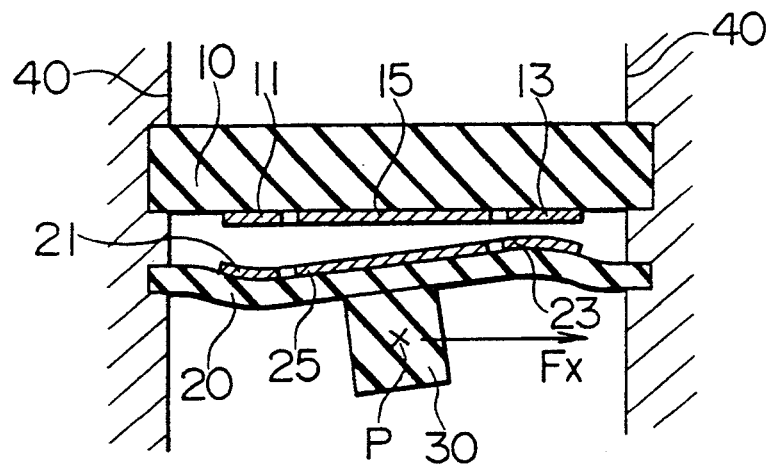
FIG. 4 is a side cross sectional view showing the state where a force component Fx in the X-axis direction is applied to the detector shown in FIG. 1.
Figure 5:
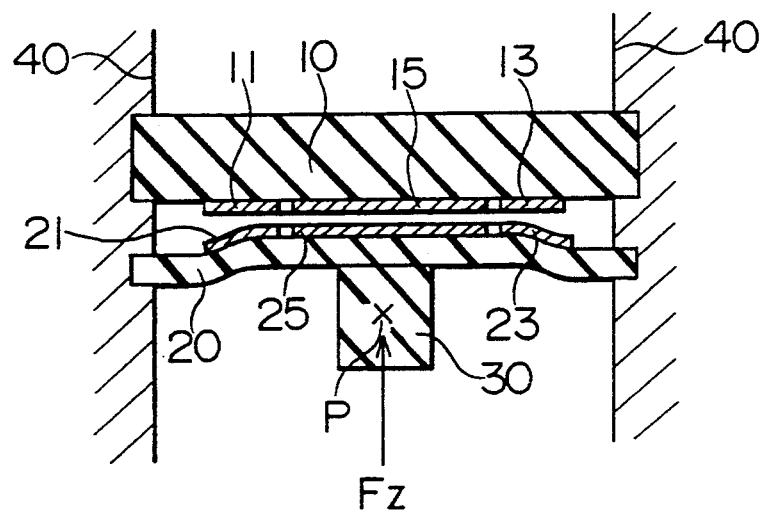
FIG. 5 is a side cross sectional view showing the state where a force component Fz in the Z-axis direction is applied to the detector shown in FIG. 1.

It is now assumed that the working point P is defined at the center of gravity of the working body 30 as shown in FIG. 1, and that a XYZ-three-dimensional coordinate system having the working point P as the origin is defined as shown. Namely, the X-axis is defined in a right direction of FIG. 1, the Z-axis is defined in an upper direction thereof, and the Y-axis is defined in a direction perpendicular to the plane surface of paper and extending toward the back side of the plane surface of paper. If the central portion to which the working body 30 is connected, the peripheral portion fixed by the detector casing 40, and the portion therebetween of the flexible substrate 20 are respectively called a working portion, a fixed portion, and a flexible portion, when an acceleration is applied to the working body 30, bending is produced in the flexible portion, so the working portion is subjected to deviate from the fixed portion. Assuming now that the entirety of this detector is mounted, e.g., in an automotive vehicle, an acceleration will be applied to the working body 30 on the basis of running of the automotive vehicle. By this acceleration, an external force is exerted on the working point P. In the state where no force is exerted on the working point P, as shown in FIG. 1, the fixed electrodes 11 to 15 and the displacement electrodes 21 to 25 are maintained in a parallel state with a predetermined spacing therebetween. It is now assumed that combinations of the fixed electrodes 11 to 15 and the displacement electrodes opposite thereto are called capacitance elements C1 to C5, respectively. Now, when a force Fx in the X-axis direction is exerted on the working point P, this force Fx allows the flexible substrate 20 to produce a moment force. As a result, as shown in FIG. 4, bending will be produced in the flexible substrate 20. By this bending, the spacing between the displacement electrode 21 and the fixed electrode 11 is increased, but the spacing between the displacement electrode 23 and the fixed electrode 13 is decreased. When a force exerted on the working point P is assumed to be -Fx in an opposite direction, bending having the relationship opposite to the above will be produced. As stated above, when a force Fx or -Fx is exerted, any change appears in the electrostatic capacitance of the capacitance elements C1 and C3. Accordingly, by detecting this change, it is possible to detect the force Fx or -Fx. At this time, although respective spacings between displacement electrodes 22, 24 and 25 and fixed electrodes 12, 14 and 15 partially increase or decrease, their spacings may be assumed to be unchanged as a whole. On the other hand, in the case where a force Fy or -Fy in the Y direction is exerted, changes similar to the above are produced only in connection with the spacing between the displacement electrode 22 and the fixed electrode 12 and the spacing between the displacement electrode 24 and the fixed electrode 14. Further, in the case where a force Fz in the Z-axis direction is exerted, as shown in FIG. 5, the spacing between the displacement electrode 25 and the fixed electrode 15 becomes small. In contrast, in the case where a force -Fz in an opposite direction is exerted, this spacing becomes large. At this time, the spacings between the displacement electrodes 21 to 24 and the fixed electrodes 11 to 14 also become small or large. In this case the spacing between the displacement electrode 25 and the fixed electrode 15 most conspicuously varies. In view of this, by detecting the change of the electrostatic capacitance of the capacitance element C5, it is possible to detect the force Fz or -Fz.

When it is assumed that the electrode area, the electrode interval and the dielectric constant are represented by S, d and E, respectively, the electrostatic capacitance C of the capacitance element is generally determined by the following equation:

$$C = \epsilon S/d.$$

Accordingly, when the electrode interval becomes short, the electrostatic capacitance C becomes large, while when it becomes broad, the electrostatic capacitance C becomes small. This detector utilizes the above mentioned principle to measure changes in the electrostatic capacitance between respective electrodes, thus to detect an external force exerted on the working point P, i.e., an acceleration exerted. Namely, an acceleration in an X-axis direction is detected on the basis of changes in the capacitance between capacitance elements C1 and C3, an acceleration in a Y-axis direction is detected on the basis of changes in the capacitance between the capacitance elements C2 and C4, and an acceleration in a Z-axis direction is detected on the basis of changes in the capacitance of the capacitance element C5.

Figure 6:
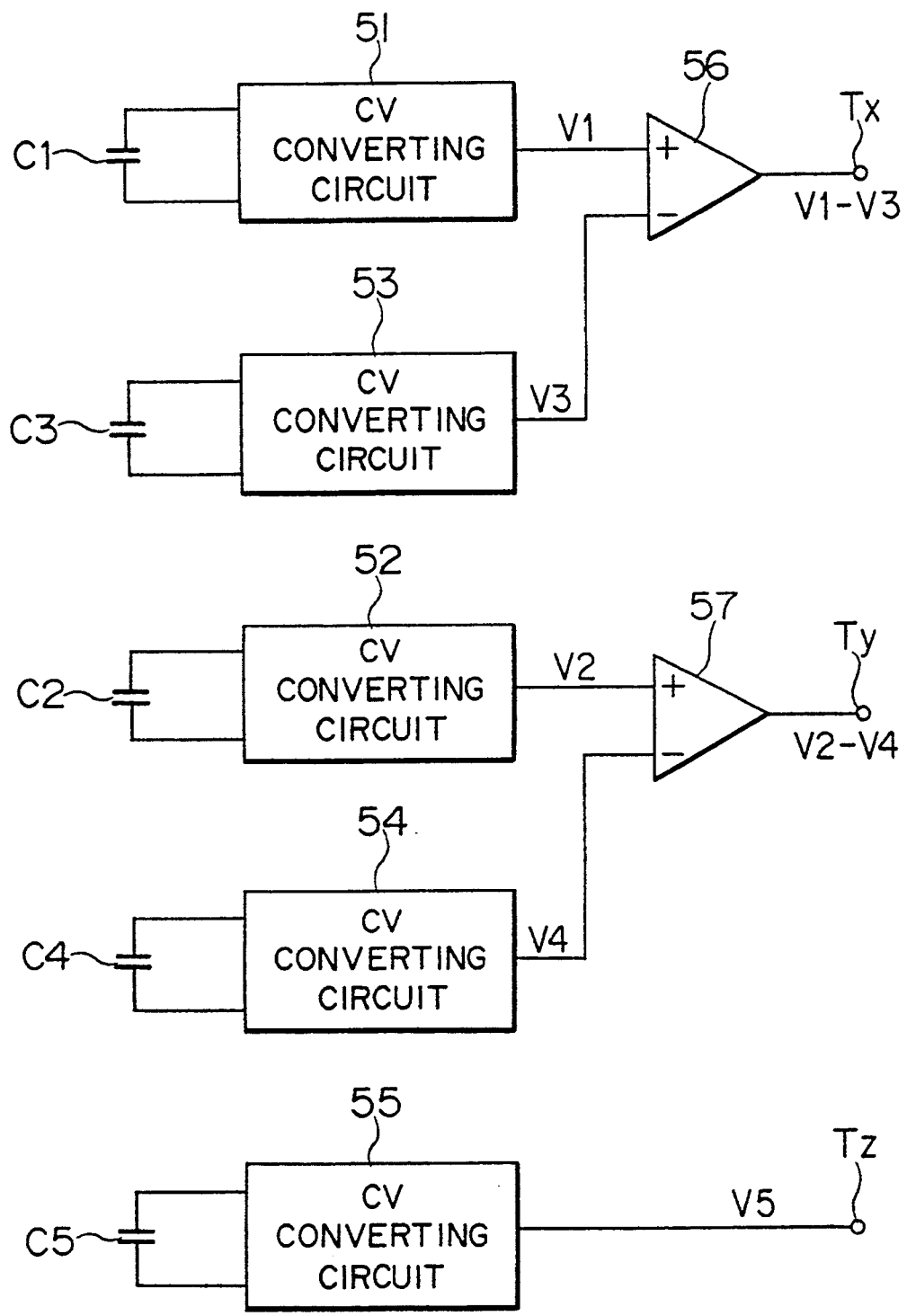
FIG. 6 is a circuit diagram showing a detection circuit used in the detector shown in FIG. 1.

Actually, respective components of acceleration along each axis are detected by a detection circuit shown in FIG. 6. In the circuit, capacitances of the capacitance elements C1 to C5 are converted to voltage values V1 to V5 by CV converting circuits 51 to 55. An acceleration in an X-axis direction is detected at a terminal Tx as a difference voltage (V1−V3) obtained by an operation element 56, an acceleration in a Y-axis direction is detected at a terminal Ty as a difference voltage (V2−V4) obtained by an operation element 57, and an acceleration in a Z-axis direction is detected at a terminal Tz as a voltage V5 itself. The description above is the basic structure and the principle of the previous acceleration detector of the prior application.

§2 Acceleration detector according to this invention

Figure 7:
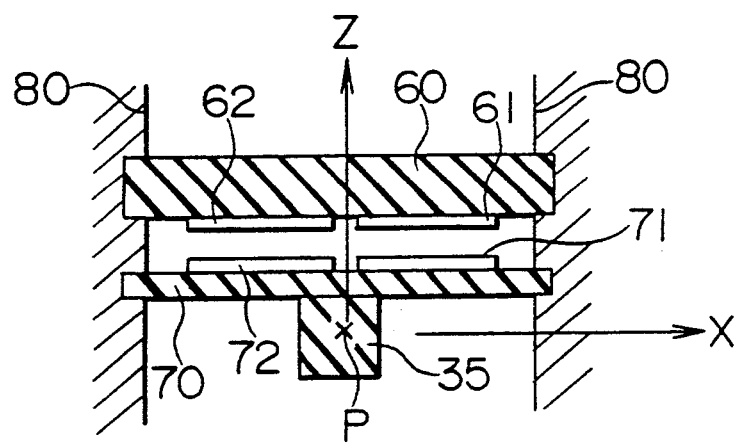
FIG. 7 is a side cross sectional view showing a basic structure of an acceleration detector according to an embodiment of this invention.
Figure 8:
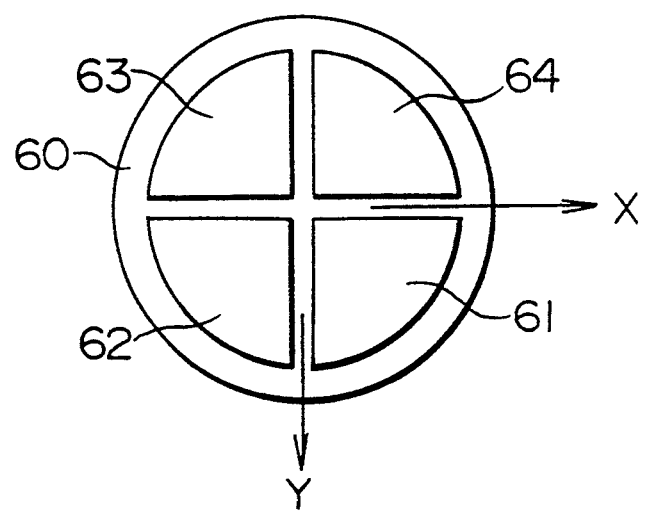
FIG. 8 is a bottom view of a fixed substrate 60 in the detector shown in FIG. 7. The cross section cut along the X-axis of the fixed substrate 60 of FIG. 8 is shown in FIG. 7.
Figure 9:
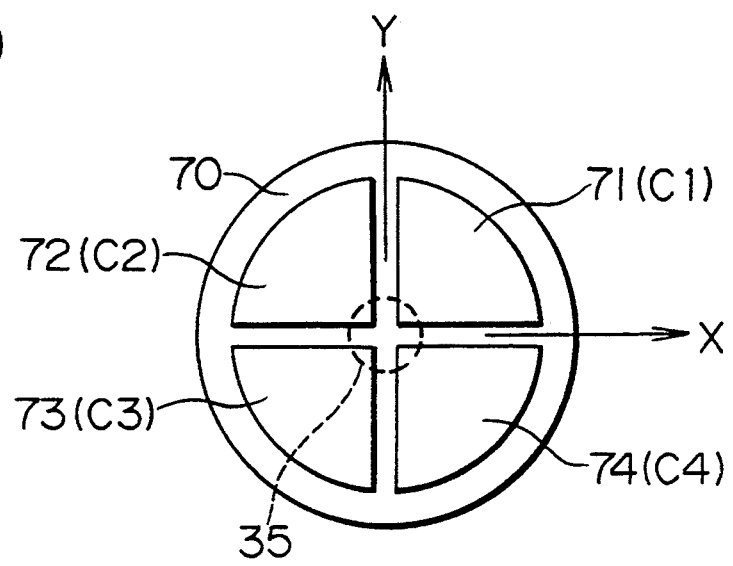
FIG. 9 is a top view of a flexible substrate 70 in the detector shown in FIG. 7. The cross section cut along the X-axis of the flexible substrate 70 of FIG. 9 is shown in FIG. 7.

An embodiment of an acceleration detector according to this invention will now be described. FIG. 7 is a side cross sectional view showing a basic structure of an acceleration detector according to this embodiment. This detector comprises, as its main components, a fixed substrate 60, a flexible substrate 70, a working body 35, and a detector casing 80 similarly to those in the previously described detector of the earlier application, but it differs from the previous detector only in the arrangement of electrodes formed on the respective substrates. The bottom view of the fixed substrate 60 is shown in FIG. 8. The cross section cut along the X-axis of the fixed substrate 60 of FIG. 8 is shown in FIG. 7. The fixed substrate 60 is a disk shaped substrate as shown, and is fixed on the detector casing 80 at its periphery. On its lower surface, fixed electrodes 61 to 64 in a quadrant shape are formed as shown. On the other hand, the top view of the flexible substrate 70 is shown in FIG. 9. The cross section cut along the X-axis of the flexible substrate 70 of FIG. 9 is shown in FIG. 7. The flexible substrate 70 is also a disk shaped substrate as shown, and is fixed on the detector casing 80 at its periphery. On its upper surface, displacement electrodes 71 to 74 in a quadrant shape are similarly formed as shown. Further, the working body 35 is columnar similarly to that of the earlier application, and is coaxially connected on the lower surface of the flexible substarte 70. The detector casing 80 is cylindrical, and fixedly supports the peripheries of the fixed substrate 60 and the flexible substrate 70.

As seen from comparison with FIGS. 1 to 3 of FIGS. 7 to 9, the detector according to this invention and the detector of the earlier application are different only in the electrode arrangement. Namely, in the detector of the earlier application, an acceleration in the X-axis direction is detected by capacitance elements C1 and C3 constituted by electrodes arranged on the X-axis (above the X-axis in a strict sense), an acceleration in the Y-axis is detected by capacitance elements C2 and C4 constituted by electrodes arranged on the Y-axis (above the Y-axis in a strict sense), and an acceleration in the Z-axis is detected by a capacitance element C5 constituted by electrodes arranged in the vicinity of the origin. Accordingly, as shown in the circuit diagram of FIG. 6, for detection of components in respective axial directions, independent dedicated capacitance elements are used, respectively. On the contrary, in the detector according to this invention, all capacitance elements are used for detection of components in respective axial directions.

Figure 10:
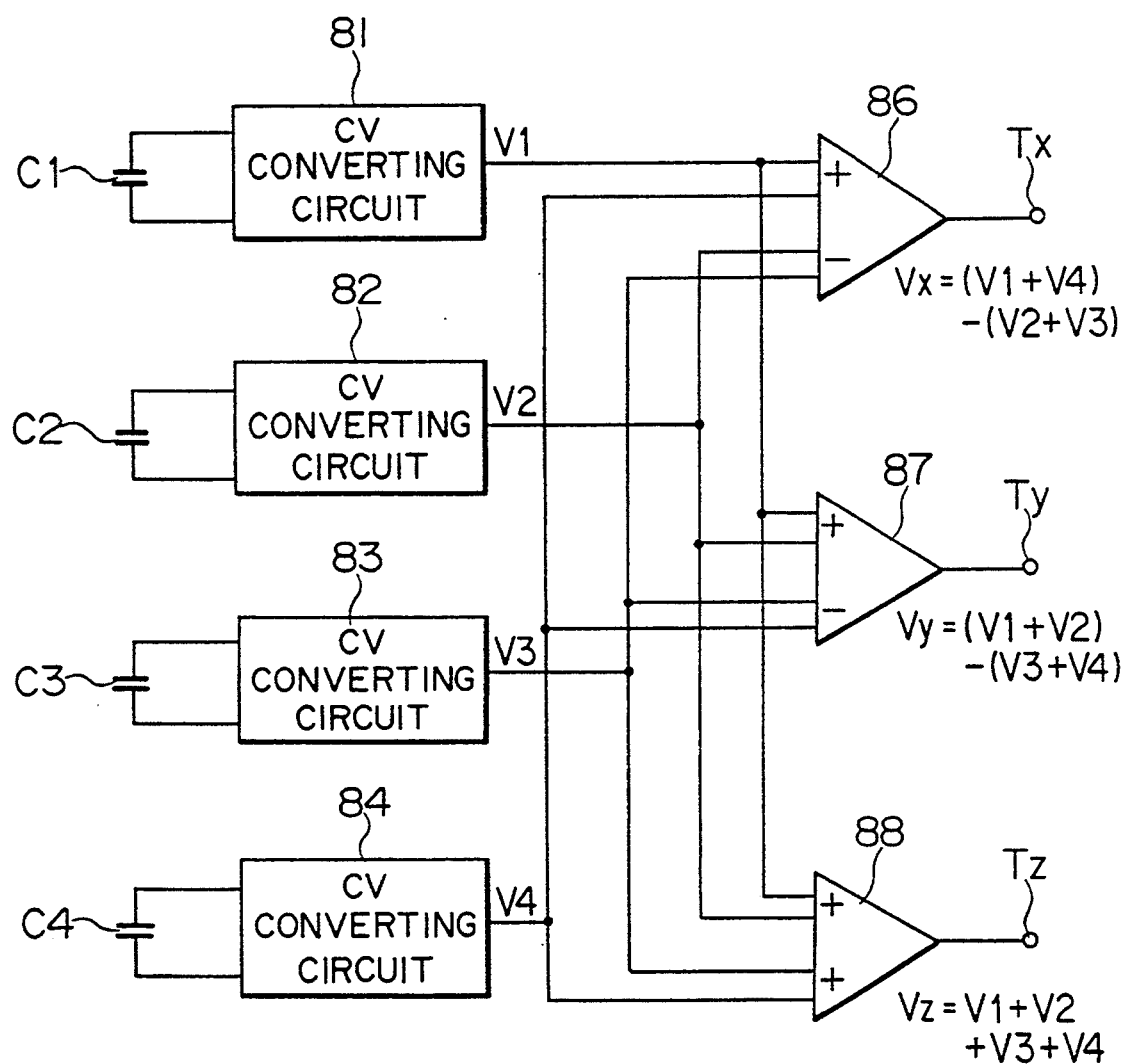
FIG. 10 is a circuit diagram showing a detection circuit used in the detector shown in FIG. 7.

In FIGS. 8 and 9, assumption is now made such that a capacitance element formed by a pair of electrodes 61 and 71 is called C1, a capacitance element formed by a pair of electrodes 62 and 72 is called C2, a capacitance element formed by a pair of electrodes 63 and 73 is called C3, and a capacitance element formed by electrodes 64 and 74 is called C4. Thus, the capacitance element C1 is arranged in the area corresponding to the first quadrant of the XY plane, the capacitance element C2 is arranged in the area corresponding to the second quadrant, the capacitance element C3 is arranged in the area corresponding to the third quadrant, and the capacitance element C4 is arranged in the area corresponding to the fourth quadrant. With respect to these capacitance elements, a detection circuit as shown in FIG. 10 is constituted. Electrostatic capacitance values of the capacitance elements C1 to C4 are converted to voltage values V1 to V4 by CV converting circuits 81 to 84, respectively. An acceleration in the X-axis direction is provided on the terminal Tx as a difference voltage Vx obtained by carrying out an operation expressed as Vx=(V1+V4)−(V2+V3) by means of an operation element 86, an acceleration in the Y-axis direction is provided on the terminal Ty as a difference voltage Vy obtained by carrying out an operation expressed as Vy=(V1+V2)−(V3+V4) by means of an operation element 87, and an acceleration in the Z-axis direction is provided on the terminal Tz as a sum total voltage Vz obtained by carrying out an operation expressed as Vz=V1+V2+V3+V4 by means of an operation element 88. An acceleration in the Z-axis direction is also provided as Vz=V1+V3 or Vz=V2+V4.

The reason why components in respective XYZ axial directions of an acceleration can be detected by the detection circuit shown in FIG. 10 can be readily understood if the manner of bending of the flexible substrate 70 when an acceleration is actually applied is considered. For example, in the cross sectional view shown in FIG. 7, let consider the case where an acceleration in the X-axis direction is applied to the working point P. In this case, the pair of electrodes of capacitance elements C1 and C4 arranged in the first and fourth quadrants become close to each other, while the pair of electrodes of capacitance elements C2 and C3 arranged in the second and third quadrants become away from each other. For this reason, the capacitance values of the capacitance elements C1 and C4 increase, while the capacitance values of the capacitance elements C2 and C3 decrease. Accordingly, if an operation of Vx =(V1+V4)−(V2+V3) is performed by using the operation element 86, a sum total of an absolute value of an increment of capacitance values of the capacitance elements C1 and C4 and an absolute value of a decrement of the capacitance values of the capacitance elements C2 and C3 can be provided as a voltage Vx. Similarly, an acceleration in the Y-axis direction can be provided as a voltage Vy by using the operation element 87. Further, if an acceleration in the Z-axis direction is applied to the working point P, pairs of electrodes of all capacitance elements C1 to C4 become close to each other, resulting in increased capacitance values. Accordingly, when an operation of Vz=V1+V2+V3+V4 is performed by using the operation element 88, a sum total of capacitance values of capacitance elements C1 to C4 can be provided as a voltage Vz.

In order to explain the merit of this invention, the electrode arrangement of FIG. 8 is compared with the electrode arrangement of FIG. 2. In the detector of this application shown in FIG. 8, even in the case where an acceleration component in any X-axis, Y-axis or Z-axis direction are detected, all of electrodes 61 to 64 are used. On the contrary, in the detector shown in FIG. 2, the component in the X-axis direction is detected by electrodes 11 and 13, the component in the Y-axis direction is detected by the electrodes 12 and 14, and the component in the Z-axis direction is detected by the electrode 15. Eventually, in accordance with the invention of this application, the electrode area contributing to detection of acceleration components in respective axial directions becomes larger than that of the earlier application. Thus, acceleration detection can be made with a higher sensitivity.

§3 Detector according to other embodiments of this invention

Figure 11:
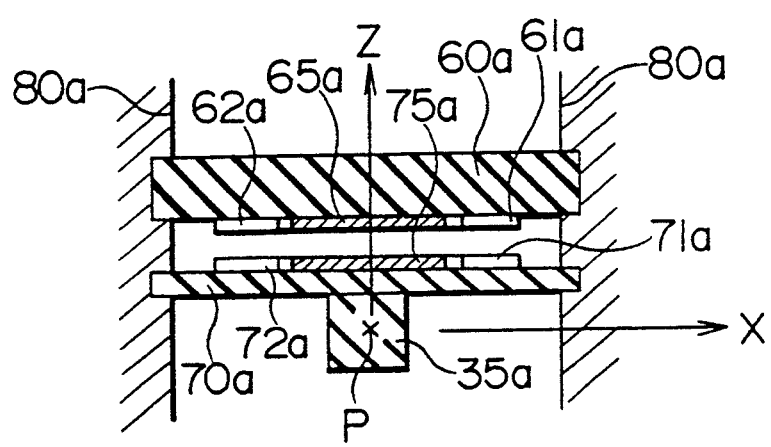
FIG. 11 is a side cross sectional view showing a basic structure of an acceleration detector according to another embodiment of this invention.
Figure 12:
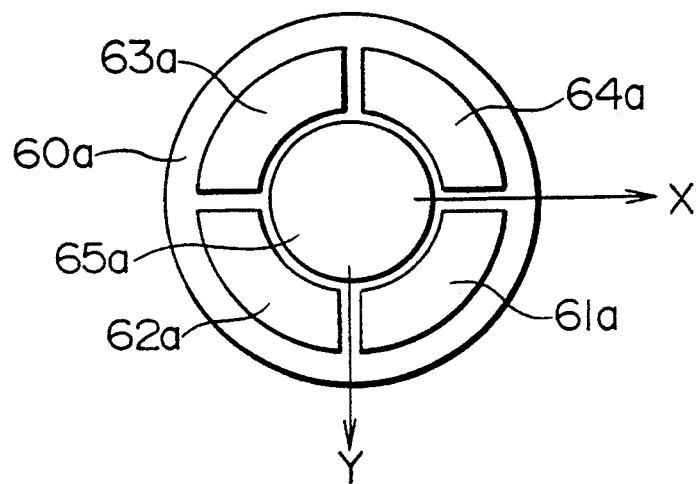
FIG. 12 is a bottom view of a fixed substrate 60a in the detector shown in FIG. 11. The cross section cut along the X-axis of the fixed substarte 60a of FIG. 12 is shown in FIG. 11.
Figure 13:
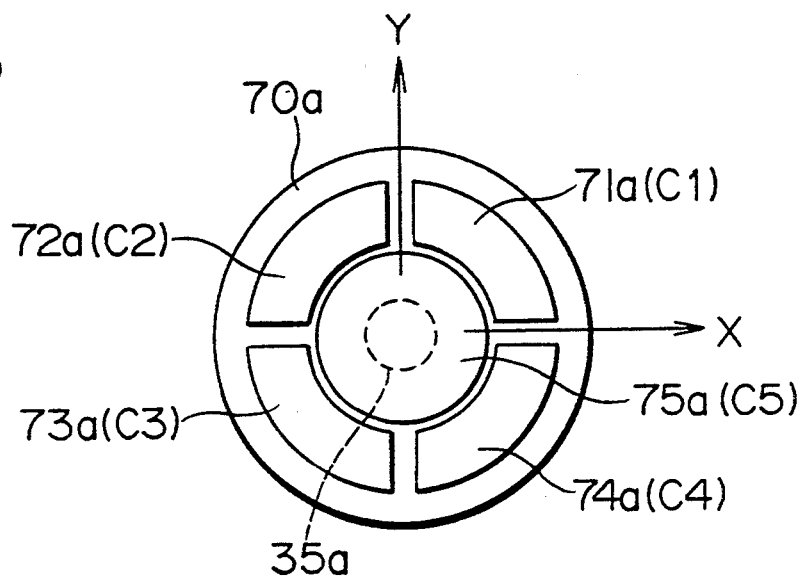
FIG. 13 is s top view of a flexible substrate 70a in the detector shown in FIG. 11. The cross section cut along the X-axis of the flexible substrate 70a of FIG. 13 is shown in FIG. 11.

Several other embodiments of a detector according to this invention will now be described. FIG. 11 is a side cross sectional view showing a basic structure of an embodiment in which five sets of electrode pairs are arranged. This detector comprises, as its main components, a fixed substrate 60a, a flexible substrate 70a, a working body 35a, and a detector casing 80a similarly to those of the first mentioned embodiment, but the shape and the arrangement of electrodes are different from the latter to some extent. The bottom view of the fixed substrate 60a is shown in FIG. 12. The fixed substrate 60a is a disk shaped substrate as shown, and is fixed on the detector casing 80a at its periphery. On its lower surface, fan shaped fixed electrodes 61a to 64a and a disk shaped fixed electrode 65a are formed as shown. On the other hand, the top view of the flexible substrate 70a is shown in FIG. 13. The flexible substrate 70a is also a disk shaped substrate as shown, and is fixed on the detector casing 80a at its periphery. On its upper surface, fan shaped displacement electrodes 71a to 74a and a disk shaped displacement electrode 75a are formed as shown. The working body 35a is columnar as its upper surface is indicated by broken lines in FIG. 13, and is coaxially connected to the lower of the flexible substrate 70a. The detector casing 80a is cylindrical, and fixedly supports the peripheries of the fixed substrate 60a and the flexible substrate 70a.

Figure 14:
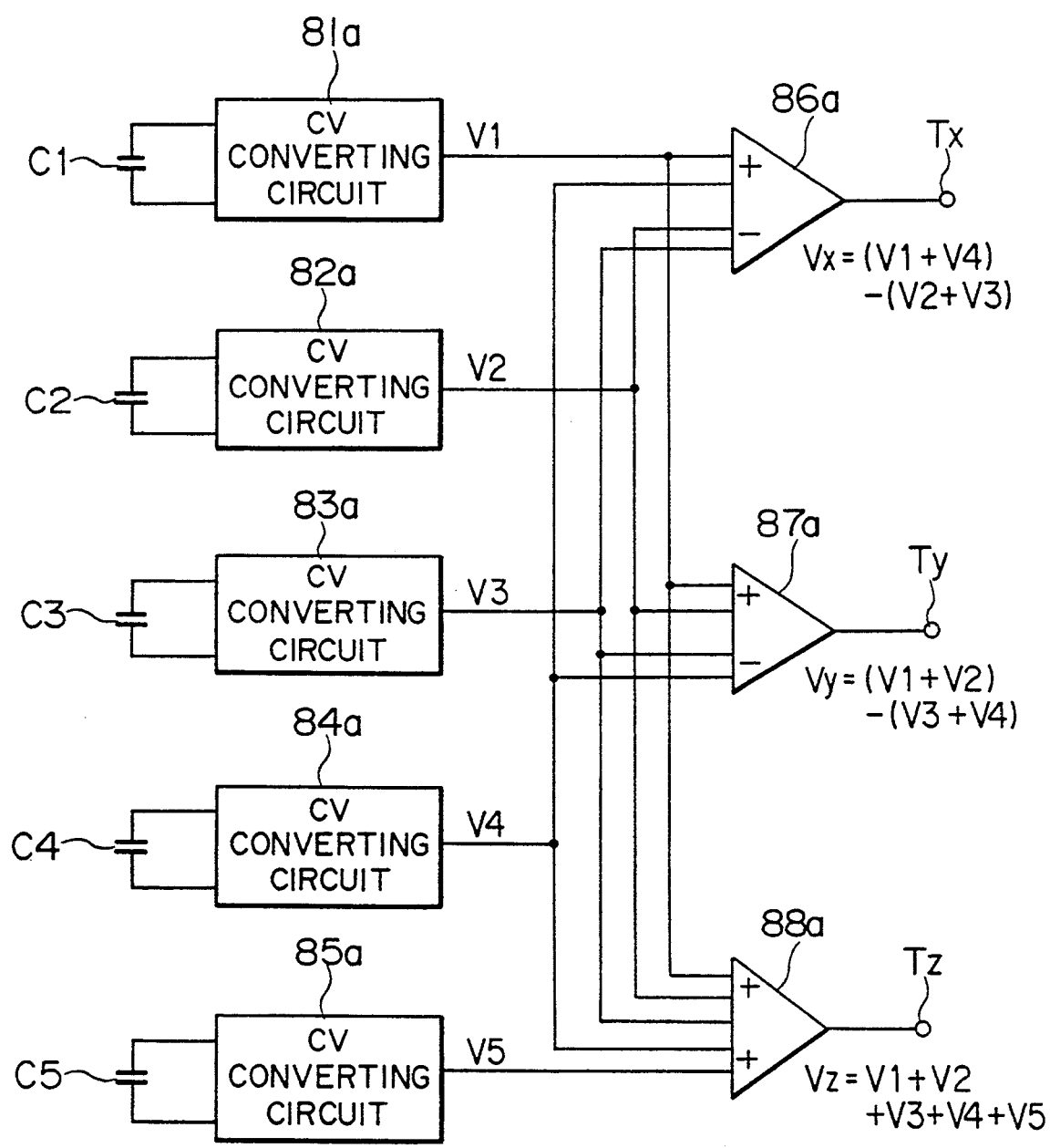
FIG. 14 is a circuit diagram showing a detection circuit used in the detector shown in FIG. 11.

When it is now assumed that combinations of fixed electrodes 61a to 65a and displacement electrodes 71a to 75a a respectively opposite thereto constitute capacitance elements C1 to C5, respectively, respective acceleration components in XYZ axial directions can be detected by a detection circuit as shown in FIG. 14. Namely, capacitance values C1 to C5 are converted to voltage values V1 to V5 by CV converting circuits 81a to 85a, respectively. More particularly, an acceleration in the X-axis direction is provided on the terminal Tx as a difference voltage obtained by performing an operation expressed as Vx=(V1+V4)−(V2+V3) by means of an operation element 86a, an acceleration in the Y-axis direction is provided on the terminal Ty as a difference voltage obtained by performing an operation expressed as Vy=(V1+V2)−(V3+V4) by means of an operation element 87a, and an acceleration in the Z-axis direction is provided on the terminal Tz as a sum total voltage Vz obtained by performing an operation expressed as Vz=V1+V2+V3+V4+V5 by means of an operation element 88a.

Figure 15:
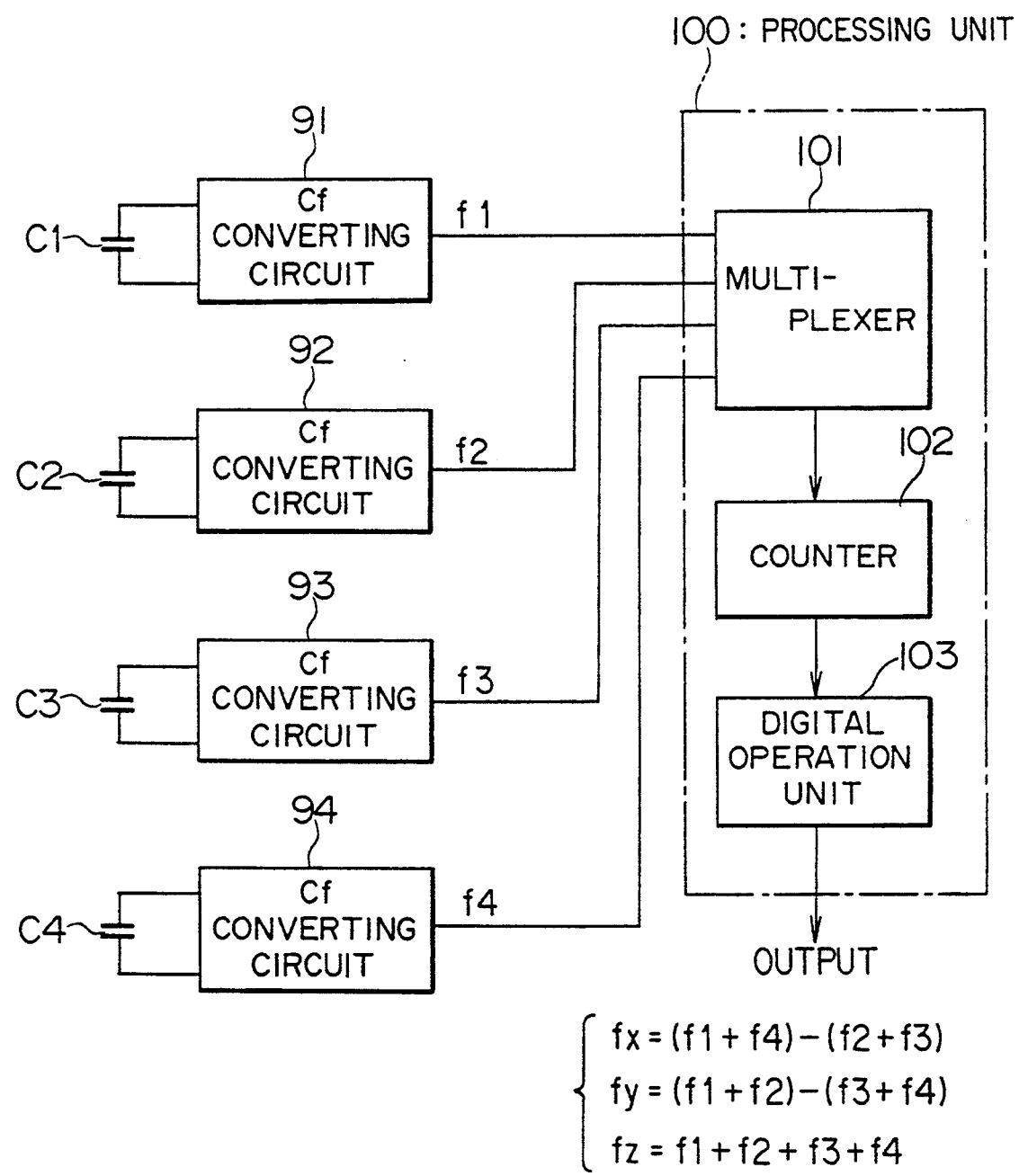
FIG. 15 is a circuit diagram showing another detection circuit used in the detector shown in FIG. 7.

Several embodiments are conceivable also in connection with the detection circuit. For example, with respect to the detection device shown in FIG. 7, a detection circuit shown in FIG. 15 may be used in place of the detection circuit shown in FIG. 10. In the circuit shown in FIG. 15, capacitance values of respective capacitance elements C1 to C4 are converted to frequencies f1 to f4 by Cf converting circuits 91 to 94, and are then processed by a processing unit 100. Namely, frequencies f1 to f4 are delivered to a counter 102 in a predetermined order by a multiplexer 101. The counter 102 delivers count values corresponding to respective frequency values to a digital operation unit 103. The digital operation unit 103 carries out additive and subtractive operation with respect to digital quantities corresponding to the respective frequency values f1 to f4 to calculate a component in the X-axis direction of an acceleration as fx=(f1+f4)−(f2+f3), to calculate a component in the Y-axis direction of the acceleration as fz=(f1+f2)−(f3+f4), and to calculate a component in the Z-axis direction of the acceleration as fz=f1+f2+f3+f4. It is to be noted that the detection circuits shown in FIG. 10 and 15 are indicated only for illustrative purpose, and therefore any circuit configuration capable of performing an operation with respect to the capacitance value may be used as a detection circuit used in this invention.

Figure 16:
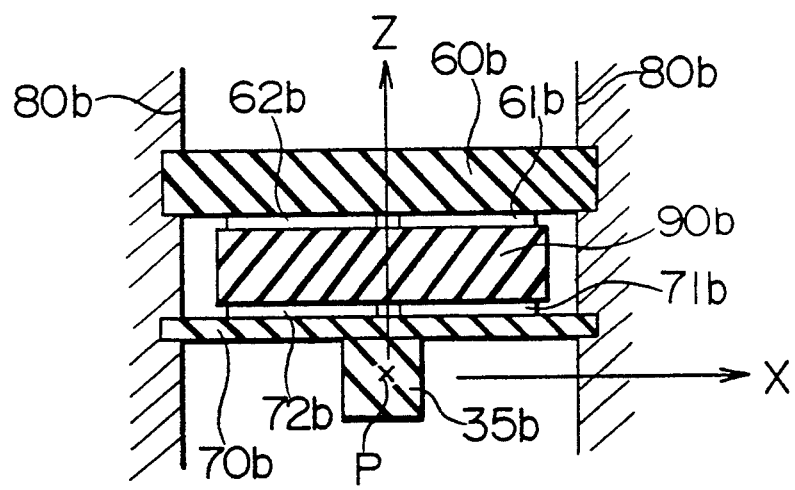
FIG. 16 is a side cross sectional view showing a basic structure of an embodiment where this invention is applied to a detector using piezoelectric element.

While the above described embodiments are all directed to the detector adapted for detecting an acceleration on the basis of changes in the capacitance values of capacitance elements, this invention may be applied to a detector for detecting an acceleration on the basis of changes in a voltage produced by a piezoelectric element. FIG. 16 is a side cross sectional view showing a basic structure of an embodiment of an acceleration detector utilizing such a piezoelectric element. This detector is characterized in that a piezoelectric element 90b is put between opposite electrodes in the detector shown in FIG. 7. Accordingly, electrodes exactly the same as the electrodes in the embodiment of FIG. 7 may be used as respective electrodes in the embodiment of FIG. 16. In order to distinguish the embodiment of FIG. 16 from the embodiment FIG. 7, a notation is employed such that alphabetical symbol b is attached to reference numerals of respective components in FIG.

Figure 17:
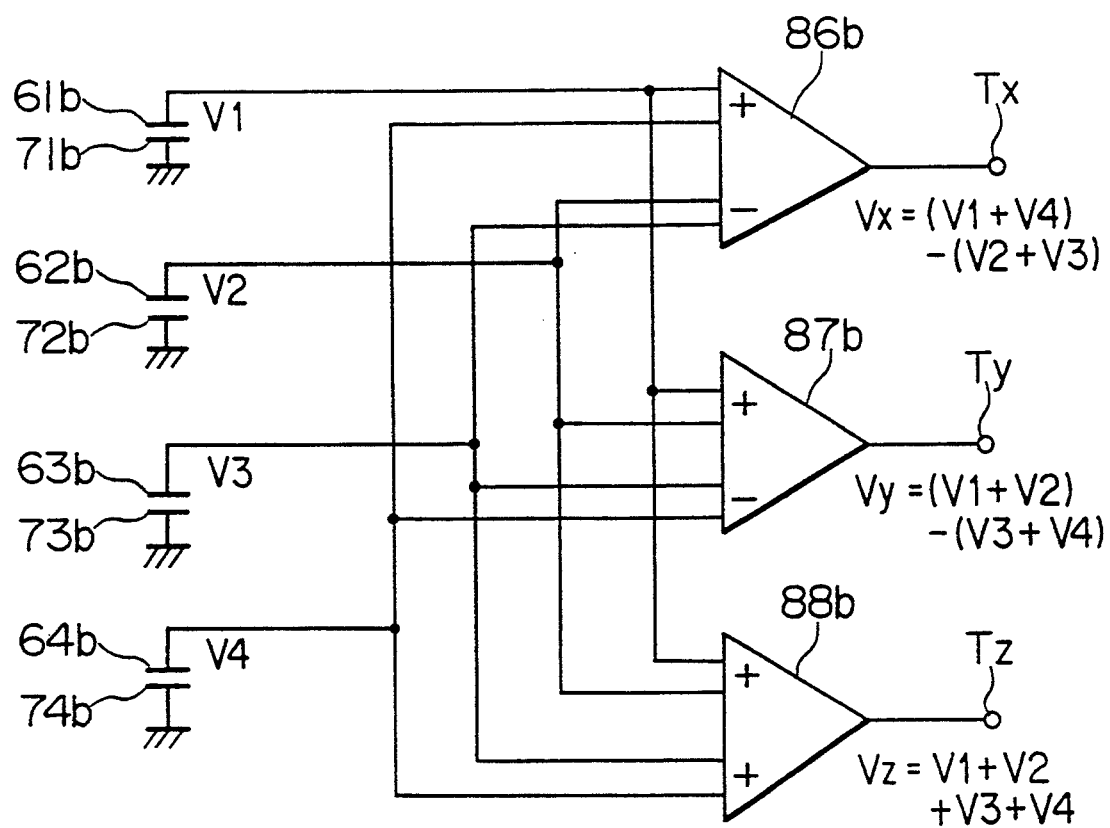
FIG. 17 is a circuit diagram showing a detection circuit used in the detector shown in FIG. 16.

16. It is a matter of course that a manufacturing method may be employed such that after electrodes are formed in advance on the both surfaces of the piezoelectric element 90b, then piezoelectric element 90b s put between the fixed substrate 60b and the flexible substrate 70b. In this embodiment, piezoelectric ceramic is used as the piezoelectric element 90b. While capacitance values of respective capacitance elements are detected in the above described detector using capacitance element, voltage values produced on respective electrode pairs are detected in place of capacitance values in this detector. Assumption is now made such that a voltage produced across electrode pair 61b, 71b arranged in the first quadrant is represented by V1, a voltage produced across electrode pair 62b, 72b arranged in the second quadrant is represented by V2, a voltage produced across electrode pair 63b, 73b arranged in the third quadrant is represented by V3, and a voltage produced across electrode pair 64b, 74b arranged in the fourth quadrant is represented by V4. Thus, components in respective axial directions of an acceleration exerted on the working point P can be detected by a detection circuit shown in FIG. 17. While CV converting circuits 81 to 84 are used to convert capacitance values to voltage values as shown in FIG. 10 in the detector using capacitance element, those CV converting circuits become unnecessary in this detector because voltage values V1 to V4 are directly obtained. Also with respect to the detector using five pairs of electrodes shown in FIGS. 11 to 13, if there is employed an arrangement such that a piezoelectric element is put between opposite electrodes, voltage values can be directly obtained.

Figure 18:
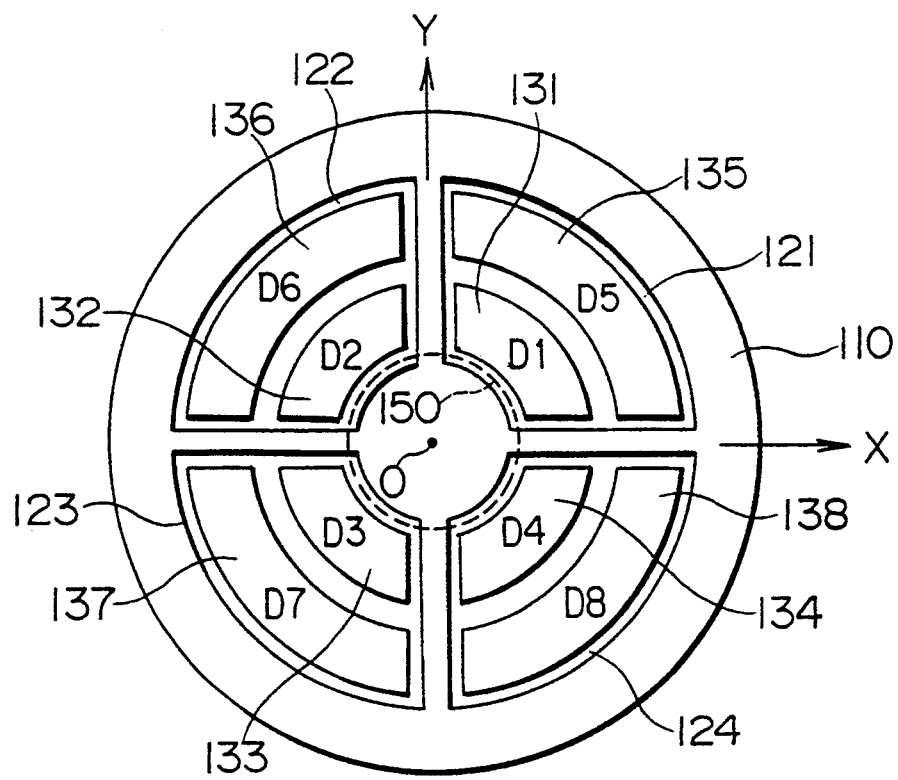
FIG. 18 is a top view showing a basic structure of another embodiment where this invention is applied to a detector using piezoelectric element.
Figure 19:
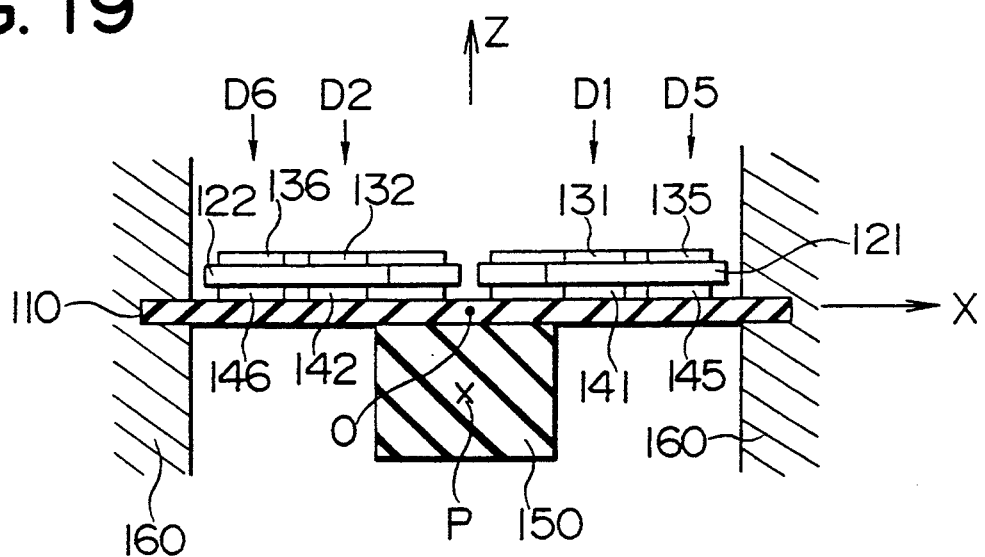
FIG. 19 is a side cross sectional view cut along the X-axis of the detector shown in FIG. 18.

A further embodiment of a detector using piezoelectric element obtained by further improving the detector disclosed in No. PCT/JP92/00882 will now be described with reference to the top view of FIG. 18 and the side cross sectional view of FIG. 19. If the origin is determined at the central portion of a disk shaped substrate 110 having flexibility, and X-axis, Y-axis and Z-axis are respectively taken in directions indicated by arrows in the figure, thus to define an XYZ three-dimensional coordinate system, detection of components in respective axial directions of an acceleration can be carried out. As shown in FIG. 18, fan shaped piezoelectric elements 121, 122, 123 and 124 are respectively arranged in the first, second, third and fourth quadrants so as to surround the origin 0 on the upper surface of the substrate 110, and respective two upper electrodes are formed on the upper surfaces of the respective piezoelectric elements. Namely, upper electrodes 131 and 135 are formed on the upper surface of the piezoelectric element 121, upper electrodes 132 and 136 are formed on the upper surface of the piezoelectric element 122, upper electrodes 133 and 137 are formed on the upper surface of the piezoelectric element 123, and upper electrodes 134 and 138 are formed on the upper surface of the piezoelectric element 124. Although not shown in FIG. 18, lower electrodes in the same shape as that of the upper electrodes 131 to 138 are formed in correspondence therewith on the lower surface of the respective piezoelectric elements. The upper electrodes 131 to 138 and the lower electrodes 141 to 148 are opposite to each other so that piezoelectric elements are put therebetween, respectively. Such a state is clearly shown in the side cross sectional view of FIG. 19. It is to be noted that while piezoelectric elements 121 to 124 are respectively constructed as separate bodies in the example of FIG. 18, a single piezoelectric element obtained by integrally forming these four piezoelectric elements 121 to 124 may be used. On the lower surface of the substrate 110, a working body 150 is connected. This working body 150 is a cylindrical weight body and has a function to produce a force on the basis of an acceleration exerted thereon to transmit this force to the portion in the vicinity of the origin 0 of the substrate 110. Further, as shown in FIG. 19, the peripheral portion of the substrate 110 is fixedly supported by a detector casing 160. When the peripheral portion of the substrate 110 and the portion in the vicinity of the origin 0 are assumed to be respectively called a peripheral area and a central area, the peripheral area of the disk shaped substrate 110 is fixed by the detector casing 160, and the central area thereof is in a free state.

Figure 20:
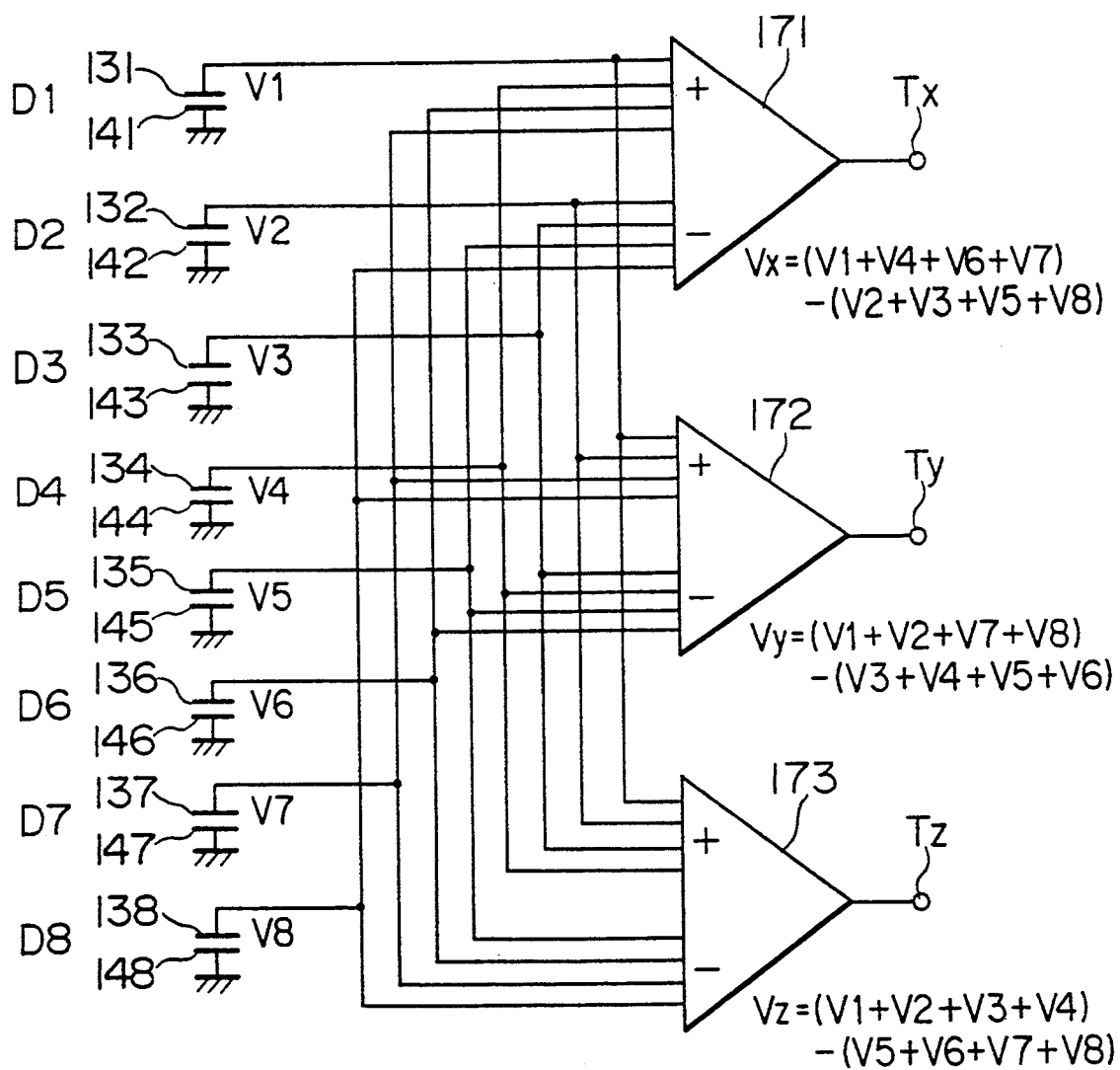
FIG. 20 is a circuit diagram showing a detection circuit used in the detector shown in FIG. 18.

When an acceleration is exerted on such a detector, bending is produced in the substrate 110. As a result, an external force is applied to respective piezoelectric elements. When assumption is made such that paired electrode 131 and 141 opposite to each other are a detection element D1, paired electrodes 132 and 142 opposite to each other are a detection element D2, paired electrode 133 and 143 opposite to each other are a detection element D3, paired electrodes 134 and 144 opposite to each other are a detection element D4, paired electrodes 135 and 145 opposite to each other are a detection element D5, paired electrodes 136 and 146 opposite to each other are a detection element D6, paired electrodes 137 and 147 opposite to each other are a detection element D7, and paired electrodes 138 and 148 opposite to each other are a detection element D8, if a detection circuit as shown in FIG. 20 is constituted with respect to voltage values V1 to V8 produced on the respective detection elements D1 to D8, detection of components in respective axial directions of an acceleration can be made. Namely, an acceleration in the X-axis direction is provided on the terminal Tx as a difference voltage obtained by performing an operation expressed as $Vx=(V1+V4+V6+V7)-(V2+V3+V5+V8)$ by means of an operation element 171, an acceleration in the Y-axis direction is provided on the terminal Ty as a difference voltage Vy obtained by performing an operation expressed as $Vy=(V1+V2+V7-V8)-(V3+V4+V5+V6)$ by means of an operation element 172, and an acceleration in the Z-axis direction is provided on the terminal Tz as a difference voltage Vz expressed as $Vz=(V1+V2+V3+V4)-(V5+V6+V7+V8)$ by means of an operation element 173. An acceleration in the Z-axis direction is also provided as $Vz=(V1+V3)-(V5+VT)$ or $Vz=(V2+V4)-(V6+V8)$.

Figure 21:
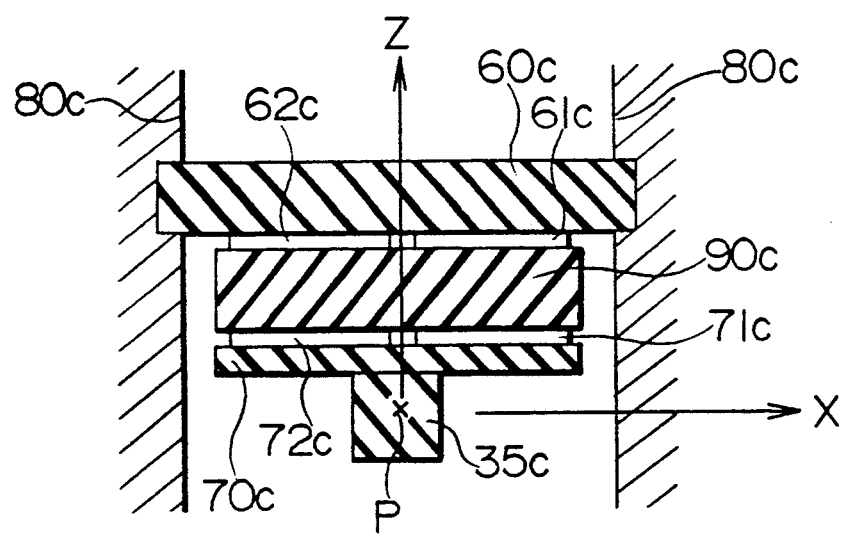
FIG. 21 is a side cross sectional view showing a basic structure of another embodiment of the invention.

FIG. 21 shows a still further embodiment of a detector using piezoelectric element. The structure of this embodiment is similar to that of the embodiment shown in FIG. 16 and therefore the same reference numerals are employed in both the embodiments with exception that an alphabetical symbol c is attached in this embodiment instead of b. The only difference between these embodiments is that a substrate 70c is used in the embodiment of FIG. 21 instead of the flexible substrate 70b. The -substrate 70c is not directly supported by the detector casing 80c but suspended in a space surrounded by the casing 80c so that the structure becomes simple. Further, the substrate 70c is not required to have flexibility. In the embodiment of FIG. 16, an applied pressure to the piezoelectric element 90b depends on both of the flexibility of the flexible substrate 70b and the mass of the working body 35b. On the contrary, in the embodiment of FIG. 21, an applied pressure to the piezoelectric element 90c depends not on the flexibility of the substrate 70c but on the mass of the working body 35c.

While the example where this invention is applied to an acceleration detector has been described, this invention may be applied to a detector force and/or magnetism. Namely, if a contact for allowing an external force to be directly exerted on the working point P, or the like is provided, the above described acceleration detectors can all function as a force detector. In addition, if the working body is constituted with a magnetic material, a magnetic force can be exerted on the working body by placing such a detector within a magnetic field, so the above described acceleration detectors can all function as a detector for magetism.

As described above, in accordance with the detector according to this invention, since detection elements are respectively arranged in the first, second, third and fourth quadrants with respect to the XY plane, arrangement of detection elements can be made by effectively utilizing a limited area. Thus, a high sensitivity detection can be carried out.

What is claimed is:

1. A force detector for detecting components in multi-dimensional directions of force in an XYZ three-dimensional coordinate system, comprising:

a fixed substrate having a fixed surface extending along substantially an XY plane, a displacement substrate having a displacement surface opposite to the fixed surface and extending along substantially the XY plane, a first capacitance element formed by a pair of electrodes provided so that they are opposite to each other on the fixed surface and the displacement surface in the first quadrant of the XY plane, a second capacitance element formed by a pair of electrodes provided so that they are opposite to each other on the fixed surface and the displacement surface in the second quadrant of the XY plane, a third capacitance element formed by a pair of electrodes provided so that they are opposite to each other on the fixed surface and the displacement surface in the third quadrant of the XY plane, a fourth capacitance element formed by a pair of electrodes provided so that they are opposite to each other on the fixed surface and the displacement surface in the fourth quadrant of the XY plane, first detection means for detecting a force component in the X-axis direction on the basis of a difference between a sum of a capacitance value of said first capacitance element and a capacitance value of said fourth capacitance element and a sum of a capacitance value of said second capacitance element and a capacitance value of said third capacitance element when the force in the X-axis direction is exerted on a predetermined working point which causes a displacement of said displacement substrate, and second detection means for detecting a force component in the Y-axis direction on the basis of a difference between a sum of a capacitance value of said first capacitance element and a capacitance value of said second capacitance element and a sum of a capacitance value of said third capacitance element and a capacitance value of said fourth capacitance element when the force in the Y-axis direction is exerted on said working point.

2. A force detector as set forth in claim 1, further comprising third detection means for detecting a force component in the Z-axis direction on the basis of a sum of a capacitance value of said first capacitance element and a capacitance value of said third capacitance element when the force in the Z-axis direction is exerted on said working point.

3. A force detector as set forth in claim 1, further comprising third detection means for detecting a force component in the Z-axis direction on the basis of a sum total of a capacitance value of said first capacitance element, a capacitance value of said second capacitance element, a capacitance value of said third capacitance element and a capacitance value of said fourth capacitance element when the force in the Z-axis direction is exerted on said working point.

4. A force detector as set forth in claim 1, which further comprises a fifth capacitance element formed by a pair of electrodes provided so that they are opposite to each other on the fixed-surface and the displacement surface in a vicinity of the origin of the XY plane, and third detection means for detecting a force component in the Z-axis direction by using a capacitance value of said fifth capacitance element.

5. A detector as set forth in claim 1, wherein a force produced resulting from an acceleration is exerted on the working point, thus permitting detection of an acceleration.

6. A detector as set forth in claim 1, wherein a force produced resulting from a magnetism is exerted on the working point, thus permitting detection of a magnetism.

* * * * *